US012677469B2

(12) United States Patent
Yoo et al.

(10) Patent No.: US 12,677,469 B2
(45) Date of Patent: Jul. 7, 2026

(54) THIN FILM TRANSISTOR MANUFACTURED BY LOW-TEMPERATURE PROCESS, MANUFACTURING METHOD OF THE SAME TRANSISTOR, TRANSISTOR DEVICE AND ELECTRONIC DEVICE INCLUDING THE SAME TRANSISTOR

(71) Applicant: KOREA ELECTRONICS TECHNOLOGY INSTITUTE, Seongnam-si (KR)

(72) Inventors: Byungwook Yoo, Seoul (KR); Min Suk Oh, Seoul (KR)

(73) Assignee: Korea Electronics Technology Institute, Seongnam-si (KR)

( * ) Notice: Subject to any disclaimer, the term of this patent is extended or adjusted under 35 U.S.C. 154(b) by 454 days.

(21) Appl. No.: 18/523,748

(22) Filed: Nov. 29, 2023

(65) Prior Publication Data

US 2024/0222466 A1     Jul. 4, 2024

(30) Foreign Application Priority Data

Dec. 30, 2022    (KR) ......................... 10-2022-0190527

(51) Int. Cl.
$H10D\ 64/68$        (2025.01)
$H10D\ 30/67$        (2025.01)

(52) U.S. Cl.
CPC ......... H10D 64/685 (2025.01); H10D 30/673 (2025.01); H10D 30/6756 (2025.01)

(58) Field of Classification Search
CPC .............. H10D 64/685; H10D 30/673; H10D 30/6756; H10D 30/6755; H10D 30/6704; H10D 30/6739; H10D 99/00; H10D 30/6757; H01L 29/78696; H01L 29/7869; H01L 29/78693; H01L 29/78606;
(Continued)

(56) References Cited

U.S. PATENT DOCUMENTS

2010/0001274 A1 *    1/2010   Ye ....................... H10D 30/6755
                                                        257/E21.414
2010/0072467 A1 *    3/2010   Yamazaki ........... H10D 86/423
                                                        257/E33.013
(Continued)

FOREIGN PATENT DOCUMENTS

JP          4759143 B2        8/2011
JP        2013-110397 A        6/2013
(Continued)

OTHER PUBLICATIONS

Office Action issued in Korean Patent Application No. 10-2022-0190527 dated May 23, 2024 in 17 pages.

*Primary Examiner* — Earl N Taylor
(74) *Attorney, Agent, or Firm* — Knobbe, Martens, Olson & Bear, LLP

(57)        ABSTRACT
Proposed is a thin film transistor that can be manufactured by a low-temperature process The thin film transistor can be manufactured at a low processing temperature and can be applied to various types of flexible substrates without deteriorating the device characteristics Also proposed are a manufacturing method to which a low processing temperature is applied as a fabricating method thereof, a semiconductor device and an electronic device including the same.

18 Claims, 12 Drawing Sheets

(58) Field of Classification Search
　　　CPC ............. H01L 29/66969; H01L 29/513; H01L
　　　　　　　　　　　　　　29/4908; H01L 29/42384
　　　See application file for complete search history.

(56) References Cited

U.S. PATENT DOCUMENTS

| 2010/0072468 | A1* | 3/2010 | Yamazaki ............ H10D 86/423 |
| | | | 257/E33.013 |
| 2021/0020784 | A1 | 1/2021 | Yano et al. |
| 2023/0402458 | A1* | 12/2023 | Joe ..................... H10D 84/0128 |

FOREIGN PATENT DOCUMENTS

| JP | 5399334 | B2 | 1/2014 |
| JP | 2015-144171 | A | 8/2015 |
| JP | 6721652 | B2 | 7/2020 |
| KR | 10-2013-0058614 | A | 6/2013 |

* cited by examiner

TABLE II. Lewis acid strength of elements and their metal-oxide bonding strength.[77]

| Elements | Electronegativity | Lewis acid strength | $Z/r^2$ | Bond strength of metal-oxygen (~kJ/mol) |
|---|---|---|---|---|
| $Sr^{2+}$ | 1.004 | 1.417 | 1.148 | 549.5 |
| $Ba^{2+}$ | 1.005 | 1.163 | 0.901 | 502.9 |
| $Ca^{2+}$ | 1.032 | 1.593 | 1.539 | 589.8 |
| $Mg^{2+}$ | 1.208 | 1.402 | 2.704 | 363.2 |
| $Y^{3+}$ | 1.209 | 1.465 | 2.774 | 719.6 |
| $La^{3+}$ | 1.212 | 0.852 | 2.184 | 799.0 |
| $Gd^{3+}$ | 1.272 | 0.788 | 2.582 | 719.0 |
| $Sc^{3+}$ | 1.316 | 1.697 | 3.830 | 681.6 |
| $In^{3+}$ | 1.445 | 1.036 | 4.152 | 320.1 |
| $Zr^{4+}$ | 1.476 | 2.043 | 5.408 | 776.1 |
| $Al^{3+}$ | 1.499 | 3.042 | 6.584 | 511.0 |
| $Ga^{3+}$ | 1.562 | 1.167 | 5.194 | 353.5 |
| $Hf^{4+}$ | 1.568 | 1.462 | 5.536 | 801.7 |
| $Ti^{4+}$ | 1.577 | 3.064 | 7.207 | 672.4 |
| $Sn^{4+}$ | 1.583 | 1.617 | 5.806 | 531.8 |
| $Nb^{5+}$ | 1.771 | 2.581 | 8.218 | 771.8 |
| $Sb^{5+}$ | 1.783 | 3.559 | 9.131 | 434.3 |
| $Si^{4+}$ | 1.769 | 8.096 | 13.717 | 799.6 |
| $Ge^{4+}$ | 1.799 | 3.059 | 8.911 | 659.4 |
| $Ta^{5+}$ | 1.881 | 1.734 | 8.218 | 799.1 |
| $B^{3+}$ | 1.966 | 10.709 | 17.847 | 808.8 |
| $Mo^{6+}$ | 2.025 | 3.667 | 11.259 | 560.2 |
| $As^{5+}$ | 2.035 | 6.220 | 13.889 | 481.0 |
| $P^{5+}$ | 2.131 | 10.082 | 18.491 | 599.1 |
| $W^{6+}$ | 2.132 | 3.158 | 11.574 | 672.0 |
| $H^+$ | 2.271 | 1.624 | 11.111 | 427.6 |
| $Se^{6+}$ | 2.289 | 9.508 | 19.133 | 468.8 |
| $Cr^{6+}$ | 2.390 | 8.203 | 17.836 | 429.3 |
| $S^{6+}$ | 2.479 | 21.362 | 32.450 | 521.7 |
| $C^{4+}$ | 2.536 | 32.917 | 44.444 | 1076.5 |
| $Mn^{7+}$ | 2.573 | 7.632 | 19.444 | 402.9 |

FIG. 2

THIN FILM TRANSISTOR MANUFACTURED BY LOW-TEMPERATURE PROCESS, MANUFACTURING METHOD OF THE SAME TRANSISTOR, TRANSISTOR DEVICE AND ELECTRONIC DEVICE INCLUDING THE SAME TRANSISTOR

CROSS-REFERENCE TO RELATED APPLICATION

This application claims priority to and the benefit of Korean Patent Application No. 10-2022-0190527, filed on Dec. 30, 2022, the disclosure of which is incorporated herein by reference in its entirety.

BACKGROUND

Technical Field

The present disclosure relates to a thin film transistor that can be manufactured by a low-temperature process, a manufacturing method thereof, a semiconductor device and electronic device including the same, and specifically to a thin film transistor that can be manufactured at a low processing temperature and can be applied to various types of flexible substrates without deteriorating the device characteristics, a manufacturing method to which a low processing temperature is applied as a fabricating method thereof, a semiconductor device and electronic device including the same.

Description of the Related Technology

As the displays develop into higher definition, higher mobility characteristics are required than thin film transistor devices using amorphous silicon semiconductors that have been used previously. Recently, polycrystalline silicon semiconductors have been used as driving elements for high-definition mobile displays, but thin-film transistors using oxide semiconductors, which are used in large OLED TVs that can be manufactured at relatively low processing costs, are also receiving a lot of attention.

SUMMARY

One aspect is a thin film transistor that can be fabricated at low processing temperatures such that it can be used on various types of flexible substrates, while maintaining the amorphous state of an oxide semiconductor that can ensure uniformity in large-area displays, and a manufacturing method thereof.

Another aspect is a thin film transistor, including a gate electrode; a first insulating layer which is formed on the gate electrode; a second insulating layer which is formed on the first insulating layer and includes an oxide of an element having a bond-dissociation energy with oxygen (O) of 500 KJ/mol or more; a channel layer which includes a semiconductor material formed on the second insulating layer; and a source electrode and a drain electrode which are formed on the first insulating layer, but are located at both ends of the channel layer so as to be not electrically connected directly to each other, but electrically connected through the channel layer, wherein the channel layer has a gradient of oxygen concentration in which the concentration of oxygen increases as it goes into the interior from the vicinity of an interface in contact with the second insulating layer.

In an embodiment of the present disclosure, an oxygen deficiency-inducing layer comprising an element having a bond-dissociation energy with oxygen of 500 KJ/mol or more may be further provided on the channel layer.

In an embodiment of the present disclosure, the element having a bond-dissociation energy with oxygen of 500 KJ/mol or more, which is included in the second insulating layer, and the element having a bond-dissociation energy with oxygen of 500 KJ/mol, which is included in the oxygen deficiency-inducing layer, may be the same.

In an embodiment of the present disclosure, the oxygen deficiency-inducing layer may include an oxide which is formed by combining oxygen included in the channel layer with an element having an oxygen bond-dissociation energy of 500 KJ/mol or more, and the oxygen deficiency-inducing layer may have an oxygen concentration gradient in which the oxygen concentration near an interface in contact with the channel layer is higher than the opposite surface.

In an embodiment of the present disclosure, the semiconductor layer may have an oxygen concentration gradient in which the oxygen concentration is highest at the center of the layer and the oxygen concentration decreases toward both interfaces in contact with the second insulating layer and the oxygen deficiency-inducing layer.

In an embodiment of the present disclosure, a semiconductor material of the channel layer may include an amorphous metal oxide.

In an embodiment of the present disclosure, the channel layer may include at least one oxide selected from amorphous zinc (Zn), indium (In), gallium (Ga), nickel (Ni), copper (Cu) and tin (Sn).

In an embodiment of the present disclosure, the channel layer may include an amorphous indium-gallium oxide.

In an embodiment of the present disclosure, the second insulating layer may be in direct contact with the source electrode and the drain electrode, but may not conduct electricity through the second insulating layer.

In an embodiment of the present disclosure, the channel layer may not exhibit diffraction peaks in the 2θ range of $30.6°\pm0.2°$ and $35.5°\pm0.2°$ in the X-ray diffraction spectrum.

In an embodiment of the present disclosure, the channel layer may have a reduction rate of oxygen concentration of 30% to 70% as calculated according to Mathematical Formula 1 below:

$$\Delta C_O(\%) = \frac{C_{Oi} - C_{Of}}{C_{Oi}} \times 100(\%) \qquad \text{[Mathematical Formula 1]}$$

wherein in Mathematical Formula 1 above, $\Delta C_O$ represents the oxygen concentration reduction rate, $C_{Oi}$ represents the oxygen concentration of the amorphous oxide included in the channel layer in a pure state, and $C_{Of}$ represents the oxygen concentration included in the entire semiconductor layer of the thin film transistor, respectively.

In an embodiment of the present disclosure, the channel layer may have a thickness of 5 nm to 100 nm.

In an embodiment of the present disclosure, the element having a bond-dissociation energy with oxygen (O) of 500 KJ/mol or more in the first insulating layer may be at least one of tantalum (Ta), strontium (Sr), calcium (Ca), gadolinium (Gd), scandium (Sc), zirconium. (Zr), aluminum (Al), titanium (Ti), niobium (Nb), silicon (Si), germanium (Ge), boron (B), molybdenum (Mo), phosphorus (P), tungsten (W), sulfur (S), hafnium (Hf), lanthanum (La), yttrium (Y) and carbon (C).

In an embodiment of the present disclosure, the element having a bond-dissociation energy with oxygen (O) of 500 kJ/mol or more in the oxygen deficiency-inducing layer may be at least one of tantalum (Ta), strontium (Sr), calcium (Ca), gadolinium (Gd), scandium (Sc), zirconium. (Zr), aluminum (Al), titanium (Ti), niobium (Nb), silicon (Si), germanium (Ge), boron (B), molybdenum (Mo), phosphorus (P), tungsten (W), sulfur (S), hafnium (Hf), lanthanum (La), yttrium (Y) and carbon (C).

In addition, the present disclosure provides a transistor device, including a plastic substrate which is composed of a polymer having a softening point of 50° C. to 350° C.; and the thin film transistor which is formed on the plastic substrate.

In an embodiment of the present disclosure, the transistor device may have a structure in which the gate electrode is in contact on the plastic substrate. It may be in the form where the remaining layers are laminated on top thereof.

In an embodiment of the present disclosure, the source electrode and the drain electrode may be in contact on the plastic substrate, and the gate electrode may not be in contact with the plastic substrate.

In an embodiment of the present disclosure, the polymer having a softening point of 50° C. to 350° C. may include at least one selected from polyethersulfone (PES), polyethylene naphthalate (PEN), polyether ether ketone (PEEK), polyethylene terephthalate (PET), polyarylate (PAR), cyclic olefin polymer (COP), polynorbornene, polycarbonate (PC), polyimide (PI) and fiber reinforced plastic (FRP).

In addition, the present disclosure provides a method for manufacturing a transistor device, including: 1) forming a gate electrode on a plastic substrate which is composed of a polymer with a softening point of 50° C. to 350° C.; 2) depositing a first insulating layer on the gate electrode such that no surface of the gate electrode is exposed; 3) forming a first oxygen deficiency-inducing layer by depositing an element having an oxygen bond-dissociation energy of 500 KJ/mol or more on the first insulating layer, and depositing a source electrode and a drain electrode on both ends of the layer, respectively; 4) depositing a semiconductor material on the first oxygen deficiency-inducing layer to form a channel layer, and forming a source electrode and a drain electrode to conduct electricity through the channel layer to manufacture a thin film transistor laminate; and 5) heat-treating the thin film transistor laminate at a temperature of 120° C. to 400° C. to oxidize the first oxygen deficiency-inducing layer so as to convert into a second insulating layer.

In another exemplary embodiment, the present disclosure provides a method for manufacturing a transistor device, including: 1) forming a channel layer by depositing a semiconductor material on a plastic substrate which is composed of a polymer having a softening point of 50° C. to 350° C., and forming a source electrode and a drain electrode on both ends of the channel layer, respectively; 2) forming a first oxygen deficiency-inducing layer by depositing an element having an oxygen bond-dissociation energy of 500 KJ/mol or more on the channel layer; 3) forming a gate insulating layer on the first oxygen deficiency-inducing layer; 4) forming a thin film transistor laminate by depositing a gate electrode on the gate insulating film; and 5) heat-treating the thin transistor laminate at a temperature of 120° C. to 400° C. to oxidize the first oxygen deficiency-inducing layer so as to convert into a second insulating layer.

In an embodiment of the present disclosure, the first oxygen deficiency-inducing layer and the channel layer may be deposited to have a thickness ratio of 1:1 to 1:8.

In addition, the present disclosure provides an electronic device, including the above-described transistor device.

In an embodiment of the present disclosure, the electronic device may be a display panel or wearable electronic device.

In an embodiment of the present disclosure, the display panel is a flexible display panel.

Since the thin film transistor of the present disclosure can be manufactured by heat treatment at a low temperature of about 150° C., it can prevent an oxide in the channel layer from crystallizing, and thus, it can maintain an amorphous state that can ensure the uniformity of a display even when it is applied to a large-area display.

In addition, since the thin film transistor of the present disclosure can be manufactured through a heat treatment process at low temperature as described above, it has the advantage of being able to apply various materials using a flexible plastic substrate, and thus, it is possible to reduce costs.

BRIEF DESCRIPTION OF THE DRAWINGS

FIG. 2 is a chart comparing the bond-dissociation energies of various cations with oxygen.

DETAILED DESCRIPTION

Figure 1A:
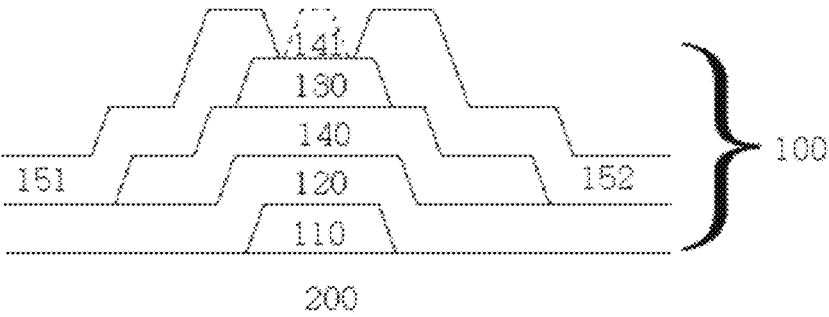
FIGS. 1A to 1F are mimetic diagrams schematically showing the layered structure of a thin film transistor manufactured by varying the lamination order according to an embodiment of the present disclosure.

Flexible displays have recently been receiving a lot of attention due to their functional advantages, but since transistor devices must be manufactured on flexible substrates, there has been a problem in that since the display backplane manufacturing process temperature cannot exceed the temperature that the flexible substrates can withstand, the conditions thereof are difficult.

For this reason, since it is difficult to lower the process temperature, substrate materials have become limited, and polyimide is currently the only plastic material used for flexible substrates.

On the other hand, if it is possible to manufacture a device with high mobility characteristics at a low processing temperature, cost savings due to the low processing temperature are also possible, and in addition to polyimide, it will be possible to use less expensive flexible substrates such as polyether sulfone (PES) or polyethylene naphthalate (PEN). However, to date, no method has been developed to dramatically lower the process temperature, and thus, the situation is that there is an emerging need to develop a method that allows structural transistor devices to be manufactured at low temperatures.

Hereinafter, prior to the detailed description of the constitutions and effects of the present disclosure, the meaning of terms used in the present specification will be defined.

As used herein, the term "bond-dissociation energy with oxygen" refers to the energy released by the corresponding element (e.g., element A) while forming an A-O bond with oxygen or the energy absorbed to break the A-O bond.

As used herein, the term "including an element" means not only including the element in elemental form, but also including the element in an ionic state in a certain compound.

As used herein, the term "matrix material" refers to a raw material provided to form the corresponding component in a final product, when the final product is obtained through processing of the raw material that is provided to form the corresponding component.

Hereinafter, the detailed constitutions and effects of the present disclosure will be described with reference to the attached drawings and examples.

As described above, in the case of conventional thin film transistor devices, most research has been done on improving the material of a channel layer to implement low-temperature processes, and since the characteristics of the transistor device itself change when the material changes, there have been difficulties in developing transistors with appropriate physical properties.

Accordingly, as described above, research has been conducted on a method of improving device characteristics by improving the structure of a device while using the same material instead of changing the material. When the structure of a device is improved, it may be applied in the same way even when the material is changed, and thus, it has the advantage of being more versatile than conventional research directions.

Accordingly, the inventors of the present disclosure accelerated research to improve the structure of a device and developed a thin film transistor with the same structure as the present disclosure. The present disclosure provides a thin film transistor, including a gate electrode; a first insulating layer which is formed on the gate electrode; a second insulating layer which is formed on the first insulating layer and includes an oxide of an element having a bond-dissociation energy with oxygen (O) of 500 KJ/mol or more; a channel layer which includes a semiconductor material formed on the second insulating layer; and a source electrode and a drain electrode which are formed on the first insulating layer, but are located at both ends of the channel layer so as to be not electrically connected directly to each other, but electrically connected through the channel layer, wherein the channel layer has a gradient of oxygen concentration in which the concentration of oxygen increases as it goes into the interior from the vicinity of an interface in contact with the second insulating layer.

Unlike conventional transistor devices that use metal induced crystallization (MIC) to crystallize a channel layer (metal oxide was mainly used in conventional transistor devices) at low temperature, the thin film transistor according to the present disclosure lowers the oxygen concentration in a semiconductor layer by introducing a second insulating layer including an oxygen deficiency-inducing material that is in direct contact with the semiconductor layer and has a high bond-dissociation energy with oxygen, thereby inducing oxygen deficiency in some areas of a channel layer, and thus, since it is possible to fabricate transistor devices with excellent electrical properties even in low-temperature processes, it has the advantage of being applicable to flexible plastic substrates. Conventional flexible plastic substrates were limited to polyimide materials with a high softening point (approximately 400° C. or higher), but by applying the present disclosure, it has become possible to form thin film transistors on flexible plastic substrates having a wider variety of materials, and thus, it may now be widely applied to fields that require flexible substrates, such as flexible displays and wearable devices.

When fabricating a thin film transistor device using the conventional MIC crystallization process, the high temperature conditions of 400° C. or higher were required during the heat treatment process. However, when fabricating a thin film transistor device according to the present disclosure, the heat treatment process has the advantage of being able to achieve the target physical properties of a channel layer on a flexible substrate even at temperatures as low as 150° C., and the resulting effect is that various materials may be applied, as described above.

In the structure of the thin film transistor, the second insulating layer provides an oxygen deficiency-inducing material layer including an element (oxygen deficiency-inducing material) whose bond dissociation energy (BDE) with oxygen is greater than 500 KJ/mol between a first insulating layer (gate insulating film) and a channel layer, and heat treatment is performed during the fabricating process of the thin film transistor such that the oxygen deficiency-inducing material takes away the oxygen included in the channel layer and oxidizes, thereby becoming an insulating layer. Since the oxygen deficiency-inducing material according to the present disclosure has a large bond dissociation energy with oxygen, it is greater than the bond dissociation energy with oxygen of the material (generally a metal or metalloid) which is bonded with oxygen in the oxide of the semiconductor layer. For this reason, when heat treatment is performed while the oxygen deficiency-inducing material is in contact with the channel layer, the oxygen in the channel layer breaks away from the bond and combines with the oxygen deficiency-inducing material to form an oxide, and since this direction is thermodynamically favorable, the channel layer loses oxygen from an interface that is in contact with the oxygen deficiency-inducing material, and thus, it has a concentration gradient in which the oxygen concentration increases as the distance from the interface with the oxygen-deficiency inducing material increases, and the channel layer has a reduced oxygen concentration compared to the matrix material.

Conversely, since the oxygen deficiency-inducing material steals oxygen from the channel layer and binds thereto, it has a gradient of oxygen concentration in which the oxygen concentration decreases as the distance from the interface with the channel layer increases.

In an embodiment of the present disclosure, an oxygen deficiency-inducing layer including an element having a bond-dissociation energy with oxygen of 500 KJ/mol or more may be further provided on the channel layer.

In an embodiment of the present disclosure, the element having a bond-dissociation energy with oxygen included in the second insulating layer of 500 KJ/mol or more and the element having a bond-dissociation energy with oxygen included in the oxygen deficiency-inducing layer of 500 KJ/mol or more may be the same. However, they may not necessarily be the same.

In an embodiment of the present disclosure, the oxygen deficiency-inducing layer includes an oxide which is formed by combining oxygen contained in the channel layer with an element having an oxygen bond-dissociation energy of 500 KJ/mol or more, and the oxygen deficiency-inducing layer may have an oxygen concentration gradient where the oxygen concentration near the interface in contact with the channel layer is higher than the opposite surface.

In an embodiment of the present disclosure, the semiconductor layer may have an oxygen concentration gradient in which the oxygen concentration is highest at the center of the layer and the oxygen concentration is lower toward both interfaces in contact with the second insulating layer and the oxygen deficiency-inducing layer. In other words, oxygen is taken away during heat treatment by the oxygen deficiency-inducing material included in the second insulating layer and the oxygen deficiency-inducing layer, resulting in the lowest oxygen concentration near the interface.

The attached drawings are referenced in order to describe the specific arrangement of the second insulating layer and the oxygen deficiency-inducing layer. Each layer may be laminated in various orders as long as the following conditions are satisfied.

i) The gate electrode is insulated from the source electrode and drain electrode by the first insulating layer, and the gate electrode is not in direct contact with the second insulating layer and the channel layer.

ii) The first insulating layer and the channel layer are separated by a second insulating layer therebetween.

iii) The source and drain electrodes are in contact at both ends of the channel layer, but there is no direct contact between the source and drain electrodes.

FIGS. 1A to 1F are diagrams schematically showing the layered structure of a transistor device according to an embodiment of the present disclosure.

Referring to FIG. 1A, the transistor device 1000 includes a thin film transistor 100 and a substrate 200, and in the thin-film transistor 100, a gate electrode 110, a first insulating layer 120, a second insulating layer 140 and a channel layer 130 are sequentially laminated on a substrate 200. In addition, optionally, an oxygen deficiency-inducing layer 141 may be further laminated on the channel layer. The source electrode 151 and the drain electrode 152 are laminated on the first insulating layer 120, the second insulating layer 140 and the channel layer 130, respectively, and are present at both ends of the channel layer 130. In addition, it can be confirmed that the source electrode 151 and the drain electrode 152 are not in direct contact with each other and are electrically conductive through the channel layer 130.

Additionally, the oxygen deficiency-inducing layer 141, which can be selectively laminated, may be laminated on the channel layer 130, but does not directly contact the source electrode 151 and the drain electrode 152.

Figure 1B:
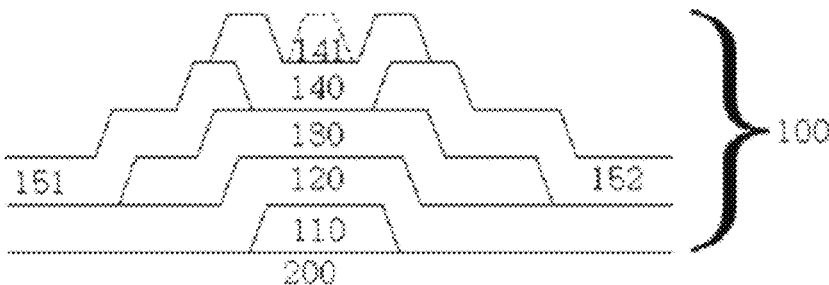

In FIG. 1B, similar to FIG. 1A, the gate electrode 110, the first insulating layer 120, the second insulating layer 140 and the channel layer 130 are laminated in that order on the substrate 200, and optionally, an oxygen deficiency-inducing layer 141 may be laminated on the channel layer 130. In the exemplary embodiment of FIG. 1B, the structural difference from FIG. 1A is that the second insulating layer 140 is laminated first, the source electrode 151 and the drain electrode 152 are laminated thereon to be spaced apart from each other, and then, the channel layer 130 is laminated and arranged such that the source electrode 1510 and the drain electrode 152 may conduct electricity via the channel layer 130.

In FIG. 1B, the oxygen deficiency-inducing layer 140 is laminated on the channel layer 130 and is not in direct contact with the source electrode 151 and the drain electrode 152.

Figure 1C:
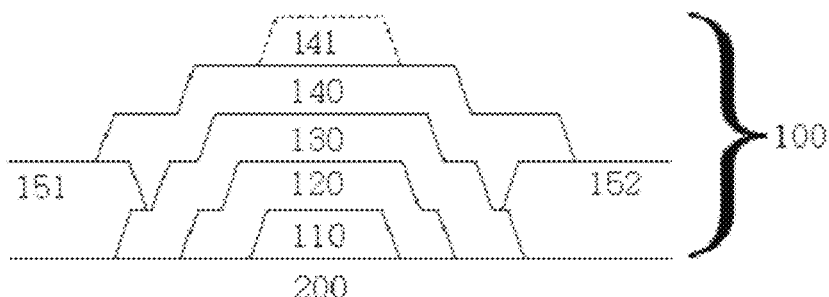

FIG. 1C is laminated in a similar order to FIG. 1B, but it is a form where the source electrode 151 and the drain electrode 152 are laminated such that they can be in direct contact with the substrate, and it is a form that limits the areas of the first insulating layer 120 and the second insulating layer 140.

Figure 1D:
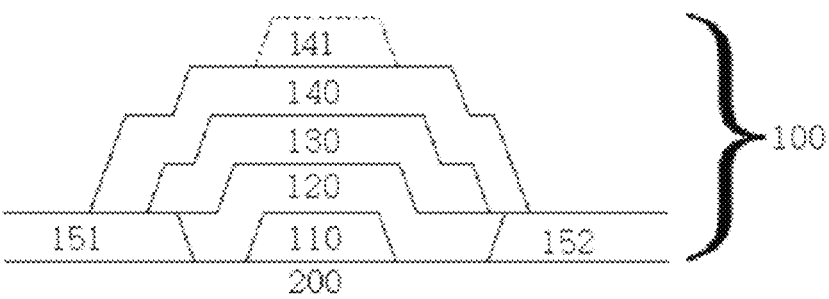

FIG. 1D is configured such that the source electrode 151, the gate electrode 110 and the drain electrode 152 are deposited in this order to be spaced apart from each other on the substrate 200, and after the first insulating layer 120 and the second insulating layer 140 are formed in that order therebetween, a channel layer 130 is formed thereon such that it conducts electricity through the channel layer.

In an embodiment of the present disclosure, the second insulating layer is in direct contact with the source electrode and the drain electrode, but it may not conduct electricity through the second insulating layer.

Figure 1E:
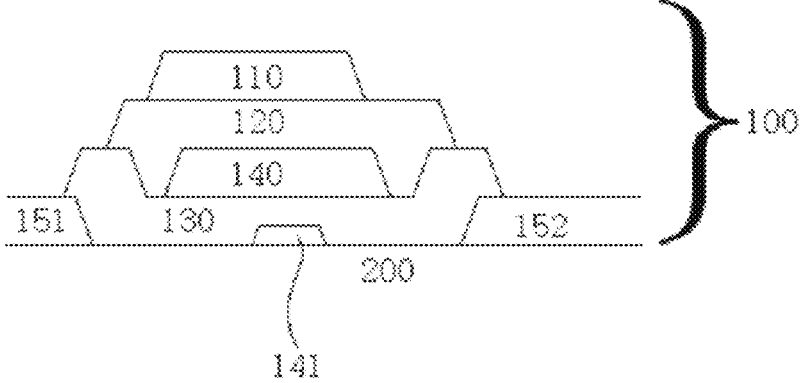
Figure 1F:
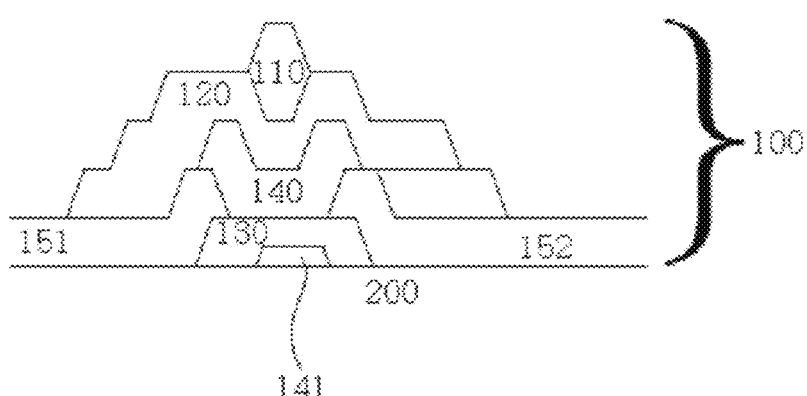

FIGS. 1E and 1F are forms where the gate electrode 110 is laminated to be spaced apart from the substrate 200, and have a form where the channel layer 130, the second insulating layer 140, the first insulating layer 120 and the gate electrode 110 are laminated in this order on the substrate. In this case, FIG. 1E has a form where the source electrode 151 and the drain electrode 152 are first deposited on the substrate 200, and then, the channel layer 130 is deposited thereon, and FIG. 1F has a form where after depositing the channel layer 130 first, the source electrode 151 and the drain electrode 152 are deposited to be spaced apart from both ends, and the remaining layers are deposited thereon.

In this case, in FIGS. 1E and 1F, an oxygen deficiency-inducing material may be first deposited before the deposition of the channel layer 130 to form the oxygen deficiency-inducing layer 141 first, and then, the channel layer 130 may be formed thereon.

Hereinafter, each constitution will be described.

The thin film transistor 100 of the present disclosure has a gate electrode 110 formed on one side that is centered on the first insulating film 120, a source electrode 151 and a drain electrode 152 formed on the opposite side, and the gate electrode 110 is insulated from the source electrode 151 and the drain electrode 152 by the first insulating layer 120 and the second insulating layer 140.

The gate electrode 110 may be composed of a metal selected from aluminum (Al), chromium (Cr), copper (Cu), tantalum (Ta), titanium (Ti), molybdenum (Mo), tungsten (W) or an alloy thereof.

The first insulating film 120 is preferably selected from a material having a sufficiently high permittivity to insulate the gate electrode 110 from the source electrode 151 and the drain electrode 152. The gate insulating film 120 may preferably be silicon oxide ($SiO_2$), silicon oxynitride ($SiO_xN_y$), aluminum oxide ($Al_2O_3$), aluminum oxynitride ($(AlN)_x \cdot Al_2O_3)_{1-x}$) or a composite film thereof.

The channel layer 130 is formed on the opposite surface of the gate electrode 110 based on the first insulating film 120, and the semiconductor material of the channel layer 130 may include an amorphous metal oxide. The channel layer 130 may be, for example, at least one metal oxide layer selected from zinc (Zn), indium (In), gallium (Ga), nickel (Ni), copper (Cu) and tin (Sn). Preferably, the channel layer 130 may be an indium-gallium oxide (IGO) layer.

The thin film transistor 100 according to the present disclosure may be provided with an amorphous channel layer 130 between the source electrode 151 and the drain electrode 152 such that it has the advantage of providing excellent uniformity of physical properties even when it is applied to a display panel. In addition, it is possible to satisfy high charge mobility and constant current test conditions at the same time.

Figure 3:
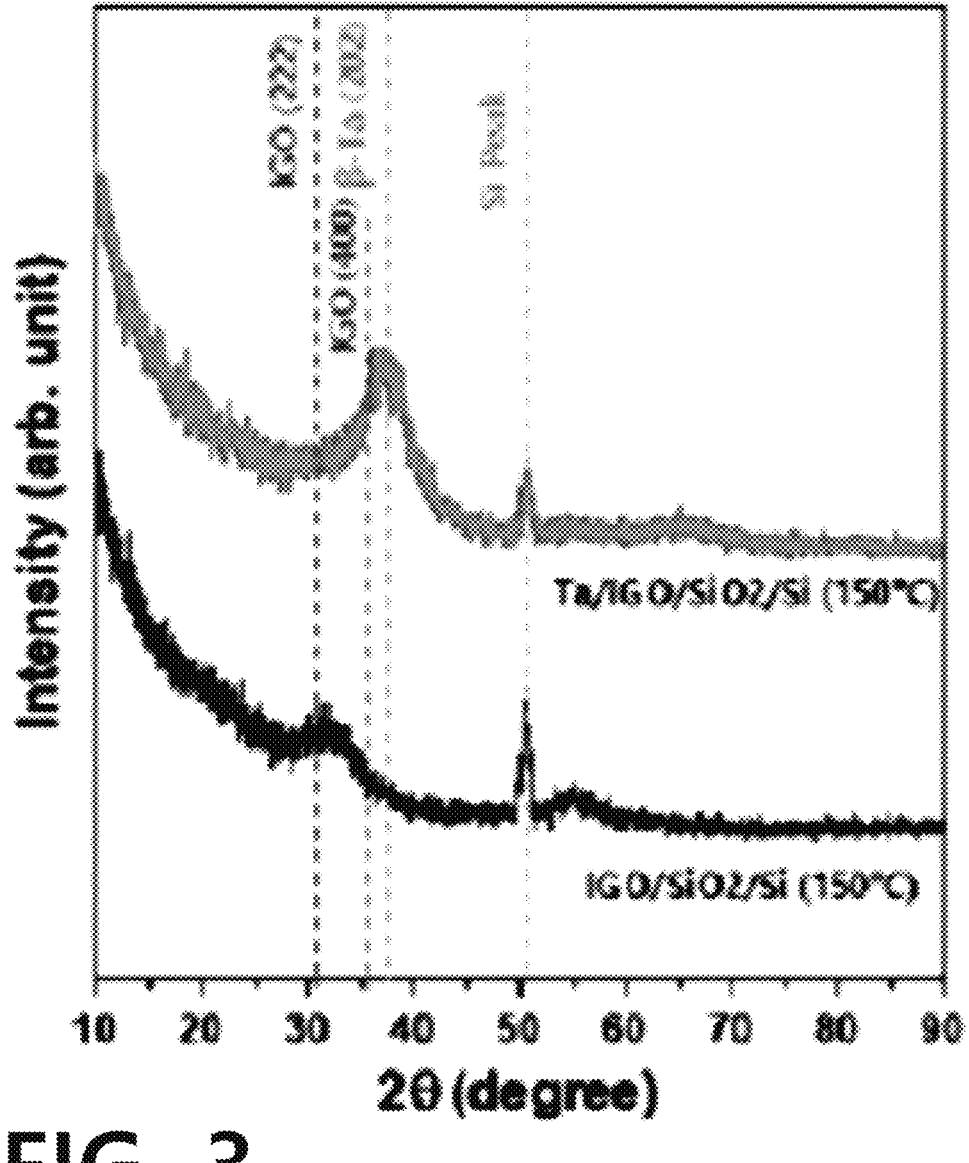
FIG. 3 is a graph comparing the XRD spectra of a thin film transistor device (top) manufactured according to an embodiment of the present disclosure and a thin film transistor device (bottom) having a structure according to the related art, respectively.
Figure 4A:
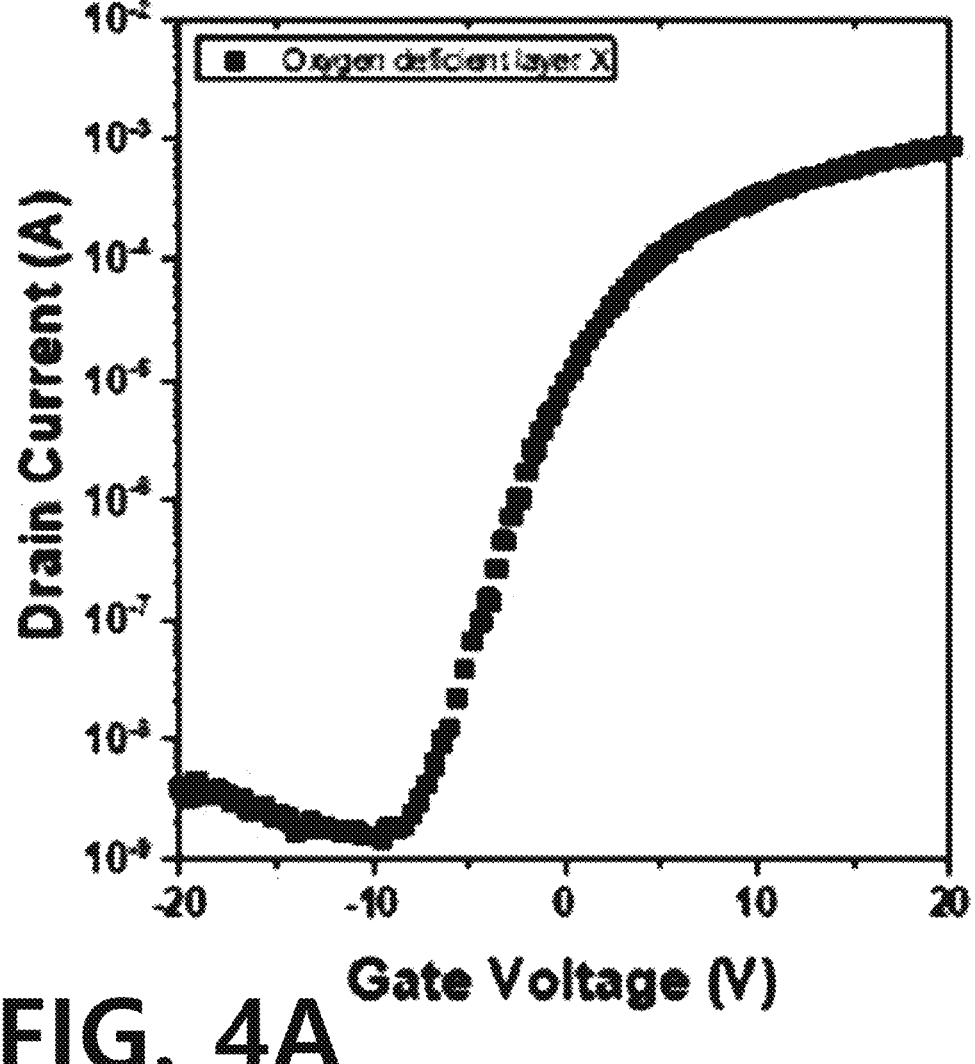
FIGS. 4A and 4B are graphs showing the transfer characteristics (drain current-gate voltage) results of a thin film transistor device according to the related art and a thin film transistor device according to an embodiment of the present disclosure, respectively.
Figure 4B:
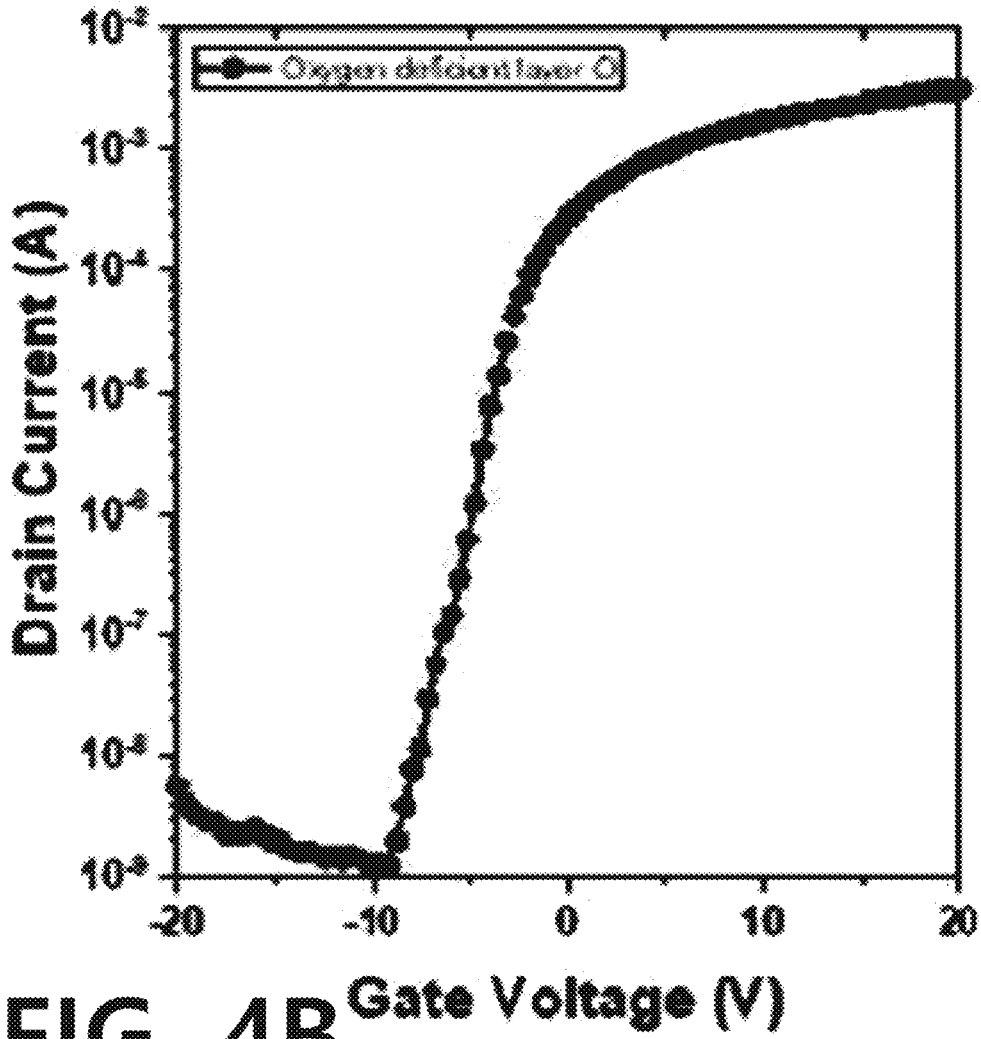
Figure 5A:
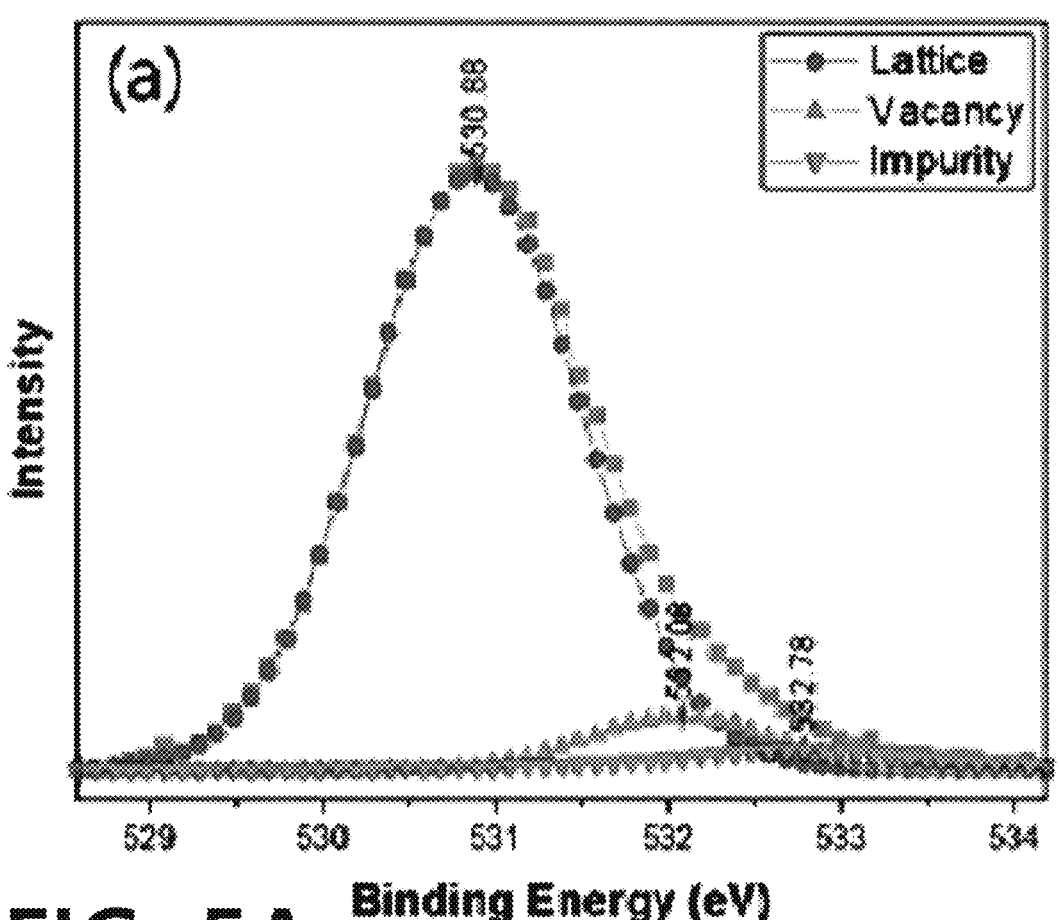
FIGS. 5A and 5B are graphs analyzing the photoelectron spectroscopy (XPS) spectra in the oxygen Is state of a thin film transistor having a layered structure according to the related art without a second insulating layer and a thin film transistor according to an embodiment of the present disclosure with a second insulating layer, respectively.
Figure 5B:
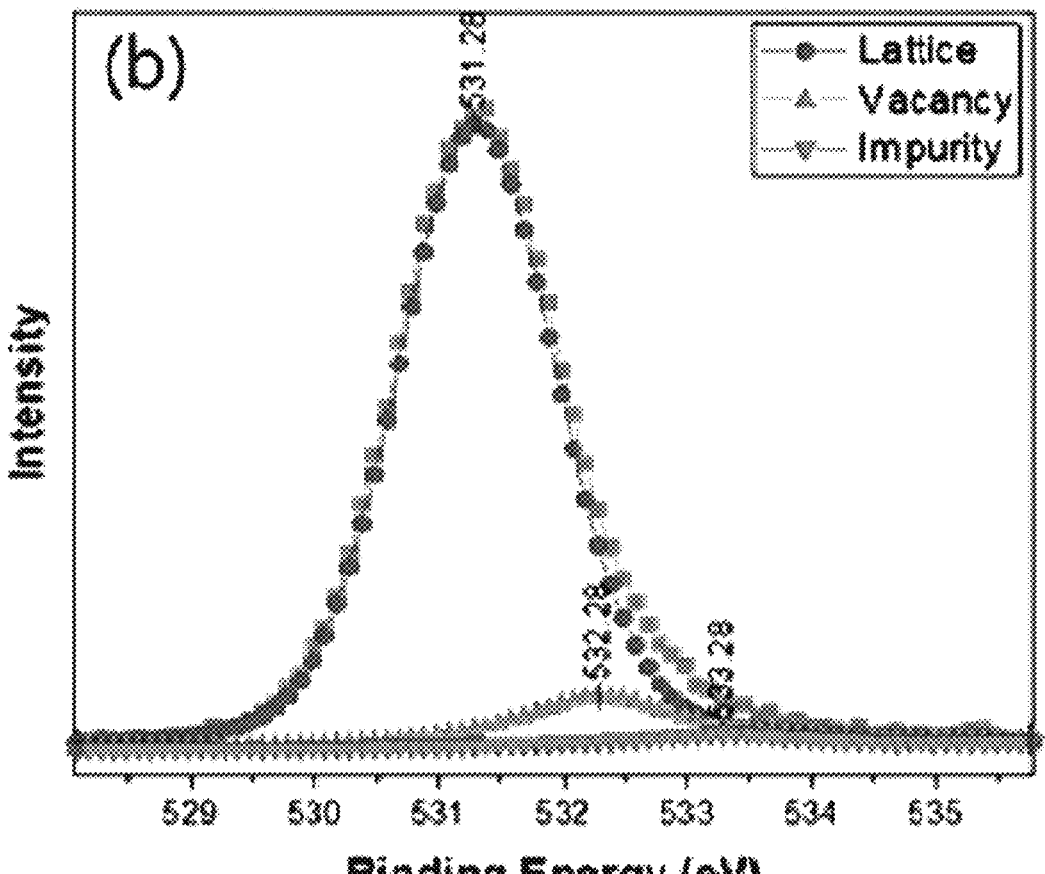

FIG. 3 is a diagram comparatively illustrating the X-ray diffraction spectra of a thin film transistor (upper red line) having oxygen deficiency-inducing layers 140, 141 that are in contact with the semiconductor layer 130 according to an embodiment of the present disclosure and a thin film transistor (bottom black line) without oxygen deficiency induction layers 140, 141 according to the related art.

Referring to FIG. 3, both of the thin film transistor 100 of the present disclosure and the thin film transistor according to the related art adopt an indium-gallium oxide (IGO) as the channel layer 130, and it can be confirmed that whereas the red line of the thin film transistor 100 of the present disclosure does not show diffraction peaks of the (222) plane and (400) plane of the IGO crystal, which is an oxide layer, the thin film transistor of the related art indicated by the black line shows a diffraction peak at the (222) plane of the IGO crystal. That is, it can be seen that in the thin film transistor 100 according to the present disclosure, all metal oxides of the channel layer 130 are in an amorphous state.

When the heat treatment temperature for IGO oxide crystals is raised above 400° C., generally peaks are clearly observed at 20 values around 30.6°±0.2° and 35.5°±0.2°, which correspond to the (222) and (400) planes of crystals, respectively, and it is known that it has been observed to exhibit a typical body-centered cubic bixbyite crystal structure. This is indicated by a black line in FIG. 3, which is the X-ray diffraction spectrum for the IGO crystal of the thin film transistor manufactured according to the related art.

However, after heat treatment at 150° C., almost no peaks were observed in the above-mentioned region in the X-ray diffraction spectrum of IGO oxide, which is the channel layer of a thin film transistor, and this indicates that the semiconductor thin film exists in an amorphous state at a heat treatment temperature of 150° C. This is indicated by a red line in FIG. 3, which is the X-ray diffraction spectrum for the IGO crystal, which is the channel layer of the thin film transistor manufactured according to the present disclosure. Although it was described as the IGO crystal in the previous sentence, referring to FIG. 6, it can be seen that the channel layer is actually amorphous.

In an embodiment of the present disclosure, the channel layer 130 may include at least one oxide selected from amorphous zinc (Zn), indium (In), gallium (Ga) and tin (Sn). More preferably, the channel layer 130 may include an amorphous indium-gallium oxide.

The indium-gallium oxide may preferably have a molar ratio of indium and gallium of 30:70 to 90:10. Indium has the property of increasing carrier conductivity within semiconductor components, and gallium has the semiconductor property of suppressing carriers to maintain low current values when the semiconductor device is turned off. Therefore, if the molar ratio of indium:gallium is less than 10:90 (i.e., if there is too much gallium), the force suppressing the semiconductor carriers becomes too strong, which may lead to a problem of the deterioration of device characteristics, and if it is greater than 95:5 (i.e., if there is too much indium), there may be a problem in that the device loses the semiconductor properties and becomes only conductive.

In an embodiment of the present disclosure, the channel layer may have a reduction rate of oxygen concentration of 30% to 70% as calculated according to Mathematical Formula 1 below. That is, the concentration of oxygen in the composition of the channel layer may be 30% to 70% lower than that of the matrix material.

$$\Delta C_O(\%) = \frac{C_{Oi} - C_{Of}}{C_{Oi}} \times 100(\%) \qquad \text{[Mathematical Formula 1]}$$

In Mathematical Formula 1, $\Delta C_O$ represents the oxygen concentration reduction rate, $C_{Oi}$ represents the oxygen concentration of the amorphous oxide included in the channel layer in a pure state, and $C_{Of}$ represents the oxygen concentration included in the entire semiconductor layer of the thin film transistor, respectively.

Herein, the matrix material refers to a raw material which is provided to form the channel layer 130, and may preferably be an indium-gallium oxide (IGO). Specifically, it refers to an indium-gallium oxide before oxygen is lost to the oxygen deficiency-inducing material through heat treatment. In the thin film transistor according to an embodiment of the present disclosure, the oxygen concentration is reduced by the oxygen deficiency-inducing material through heat treatment after the formation of each laminated structure, thereby forming the second insulating layer 140.

In this case, during the heat treatment process, the oxygen atom of the metal oxide of the channel layer 130, preferably, indium-gallium oxide, is oxidized and combines with the oxygen deficiency-inducing material due to the high bond-dissociation energy (BDE) of oxygen in the oxygen deficiency inducing material included in the layer that will become the second insulating layer 140 such that the oxygen concentration near the interface in contact with the second insulating layer 140 is reduced, and this causes a gradient in oxygen concentration. This phenomenon also a phenomenon that occurs at the contact interface, when the oxygen deficiency induction layer 141 is formed on the opposite surface of the channel layer 130.

If the oxygen concentration of the channel layer 130 is further reduced by more than 70% compared to the matrix material, the channel layer 130 may become too metallic and may not sufficiently perform its role as a switch of the transistor. If the oxygen concentration of the channel layer 130 is reduced by less than 30% compared to the matrix material, that is, if oxygen deficiency is not sufficiently induced, the change in device characteristics may be minimal.

However, this change in oxygen concentration does not occur uniformly throughout the entire channel layer, but rather mainly occurs around the interface with the second insulating layer 140 or the oxygen deficiency-inducing layer 141, and thus, a concentration gradient occurs in which the center of the channel layer 130 has a high oxygen concentration and the oxygen concentration is low near the interface, and charge transport between the source electrode 151 and the drain electrode 152 occurs in the vicinity of the interface between the channel layer 130 and the second insulating layer 140 or the oxygen deficiency induction layer 141. That is, as an oxygen concentration gradient occurs as described above, charge transport within the channel layer 130 also becomes locally non-uniform, and thus, the main charge transport path of charges (electron or hole) within the channel layer 130 is limited to the interface between the second insulator 140 and the selectively formed oxygen deficiency induction layer 141, and the presence of these layers increases oxygen vacancies and improves the mobility characteristics of the device.

In an embodiment of the present disclosure, the channel layer may have a thickness of 5 nm to 100 nm. More preferably, the channel layer may have a thickness of 10 nm to 40 nm.

In an embodiment of the present disclosure, the element (oxygen deficiency-inducing material) having a bond-dissociation energy with oxygen (O) of the second insulating layer of 500 KJ/mol or more may be at least one from tantalum (Ta), strontium (Sr), calcium (Ca), gadolinium (Gd), scandium (Sc), zirconium (Zr), aluminum (Al), titanium (Ti), niobium (Nb), silicon (Si), germanium (Ge), boron (B), molybdenum (Mo), phosphorus (P), tungsten (W), sulfur (S), hafnium (Hf), lanthanum (La), yttrium (Y) and carbon (C). For the oxygen deficiency-inducing material, a metal element may be generally used as a matrix material, but even non-metallic substances may be used as long as the bond-dissociation energy with oxygen is high.

More preferably, the second insulating layer 140 may include an oxide of tantalum (Ta). Tantalum is suitable as an oxygen deficiency-inducing material due to its characteristic of having a high bond-dissociation energy with oxygen, and the oxygen deficiency-inducing material is supplied with oxygen from the oxide of the channel layer 130 such that the oxide of tantalum is formed on the oxygen deficiency-inducing layer 140.

Further, in an embodiment of the present disclosure, the element having a bond-dissociation energy with oxygen (O) of the oxygen deficiency-inducing layer 141 of 500 KJ/mol or more may be at least one from tantalum (Ta), strontium (Sr), calcium. (Ca), gadolinium (Gd), scandium (Sc), zirconium (Zr), aluminum (Al), titanium (Ti), niobium (Nb), silicon (Si), germanium (Ge), boron (B), molybdenum (Mo), phosphorus (P), tungsten (W), sulfur (S), hafnium (Hf), lanthanum (La), yttrium (Y) and carbon (C). Similar the first insulating layer 140, for the oxygen deficiency-inducing material of the oxygen deficiency-inducing layer 141, a metal element may also be used as a matrix material, but even when it is not necessarily a metal material, it may be used if the bond-dissociation energy with oxygen is high.

The source electrode 151 and the drain electrode 152 are formed at both ends of the channel layer 130 so as to contact the channel layer 130, but the source electrode 151 and the drain electrode 152 are formed so as not to contact directly.

The source electrode 151 and the drain electrode 152 may each independently include aluminum (Al), neodymium (Nd), silver (Ag), chromium (Cr), titanium (Ti), tantalum (Ta), molybdenum (Mo) or an alloy including the same, or may be formed by using a conductive metal oxide film, but the present disclosure is not necessarily limited thereto.

In addition, the present disclosure provides a transistor device, including a plastic substrate which is composed of a polymer having a softening point of 50° C. to 350° C.; and the thin film transistor which is formed on the plastic substrate.

As described above, the transistor device of the present disclosure may be applied to plastics including a polymer with a softening point of 50° C. to 350° C., which has flexibility due to the application of the above-described thin film transistor, and according to the related art, since high-temperature heat treatment is required, it has the advantage of being applicable to more diverse and inexpensive plastic substrates, Compared to the fact that plastic substrates are limited to polyimide (PI) substrates with a high softening point of about 400° C.

By providing a transistor device formed on such a flexible plastic substrate, it may be appropriately used in areas that require flexible circuits, such as flexible displays and wearable devices, for which demand has recently increased.

In an embodiment of the present disclosure, it may have a structure in which the gate electrode is in contact with the plastic substrate. The remaining layers may be laminated on top of each other. Alternatively, the source and drain electrodes may be in contact with the plastic substrate, and the gate electrode may not be in contact with the plastic substrate.

Preferably, the plastic substrate may include a polymer having a molecular weight of 5,000 g/mol or more.

In an embodiment of the present disclosure, the polymer having a softening point of 50° C. to 350° C. may include at least one selected from polyethersulfone (PES), polyethylene naphthalate (PEN), polyether ether ketone (PEEK), polyethylene terephthalate (PET), polyarylate (PAR), cyclic olefin polymer (COP), polynorbornene, polycarbonate (PC)), polyimide (PI) and fiber reinforced plastic (FRP).

In addition, the present disclosure provides a method for manufacturing a transistor device, including the steps of:

1) forming a gate electrode on a plastic substrate which is composed of a polymer with a softening point of 50° C. to 350° C.;

2) depositing a first insulating layer on the gate electrode such that no surface of the gate electrode is exposed;

3) forming a first oxygen deficiency-inducing layer by depositing an element having an oxygen bond-dissociation energy of 500 KJ/mol or more on the first insulating layer, and depositing a source electrode and a drain electrode on both ends of the layer, respectively;

4) depositing a semiconductor material on the first oxygen deficiency-inducing layer to form a channel layer, and forming a source electrode and a drain electrode to conduct electricity through the channel layer to manufacture a thin film transistor laminate; and 5) heat-treating the thin film transistor laminate at a temperature of 120° C. to 400° C. to oxidize the first oxygen deficiency-inducing layer so as to convert into a second insulating layer.

Another aspect of the present disclosure provides a method for manufacturing a transistor device, including the steps of:

1) forming a channel layer by depositing a semiconductor material on a plastic substrate which is composed of a polymer having a softening point of 50° C. to 350° C., and forming a source electrode and a drain electrode on both ends of the channel layer, respectively;

2) forming a first oxygen deficiency-inducing layer by depositing an element having an oxygen bond-dissociation energy of 500 KJ/mol or more on the channel layer;

3) forming a gate insulating layer on the first oxygen deficiency-inducing layer;

4) forming a thin film transistor laminate by depositing a gate electrode on the gate insulating film; and 5) heat-treating the thin transistor laminate at a temperature of 120° C. to 400° C. to oxidize the first oxygen deficiency-inducing layer so as to convert into a second insulating layer.

In the method for manufacturing a transistor device, the heat treatment temperature range is formed at below the softening point of a plastic substrate including the above-described polymer with a molecular weight of 5,000 g/mol or more, and thus, in addition to polyimide, there is an advantage in that low-temperature processing is possible even on inexpensive flexible plastic substrates such as those listed above.

The former manufacturing method is a method of manufacturing a transistor device 1000 having a structure according to any one of FIGS. 1A to 1D, and the latter manufacturing method is a method of manufacturing a transistor device 1000 having a structure according to FIG. 1E or IF.

Each layer may preferably be formed by the deposition method, for example, it may be formed by depositing according to the physical vapor deposition method such as sputtering, the chemical vapor deposition (CVD) method or the atomic layer deposition (ALD) method.

Particularly, in an embodiment of the present disclosure, the first oxygen deficiency-inducing layer may be formed to have a thickness ratio of 1:1 to 1:8 with the channel layer 130. If the thickness ratio of the first oxygen deficiency-inducing layer and the channel layer 130 is 1:1 or less (i.e., if the thickness of the first oxygen deficiency-inducing layer is smaller than the channel layer thickness), the oxygen deficiency-inducing material is too much such that the first oxygen deficiency-inducing layer may not be fully oxidized. In this case, there is a problem in that current may pass through the first oxygen deficiency-inducing layer between the source electrode 151 and the drain electrode 152. In this case, the second insulating layer 140 does not function as an insulating layer. Conversely, if the thickness ratio exceeds 1:8, oxygen deficiency does not sufficiently occur in the channel layer 130, and thus, the objects of the present disclosure may not be achieved.

According to an embodiment of the present disclosure, after forming a thin film transistor 100 on the substrate 200, the transistor device 1000 may be heat-treated.

According to an embodiment of the present disclosure, when the transistor device 1000 is manufactured in a manner in which the gate electrode 110 is deposited directly on the substrate 200, after forming the channel layer 130, it may be formed by depositing an oxygen deficiency inducing material thereon, and in this case, when fabricating a transistor device 1000 having a structure according to any one of FIGS. 1A to 1D, after step 4), an oxygen deficiency-inducing material may be deposited on the channel layer 130, and then, heat treatment in step 5) may be performed. Conversely, when fabricating a transistor device 1000 having the structure of FIG. 1E or FIG. 1F, it may be performed by depositing an oxygen deficiency-inducing material before forming the channel layer 130 in step 1), and performing heat treatment in step 5) after the formation of all layers is completed.

According to an embodiment of the present disclosure, after the formation of the thin film transistor 100 on the substrate 200 is completed, "post-deposition annealing (PDA)" may be performed on the transistor device 1000. The post-deposition annealing may preferably be performed at a temperature of about 150° C. to 800° C. in an air atmosphere. However, in order to achieve the objects of the present disclosure, it is preferable to perform heat treatment after deposition in the range of 120° C. to 400° C., and more preferably, 120° C. to 200° C., in order to prevent crystallization of the channel layer 130.

In addition, as described above, since this is a process that can be applied to flexible substrates including low-cost plastics with low softening points, it has the advantage of expanding options in terms of invention purpose and cost reduction.

In addition, the present disclosure provides an electronic device including the above-described transistor device.

In an embodiment of the present disclosure, the electronic device may be a display panel or a wearable electronic device.

In an embodiment of the present disclosure, the display panel may be a flexible display panel.

Hereinafter, the effects of the present disclosure will be described in more detail through specific examples. However, the scope of the present disclosure should not be construed as limited to the following examples. A person skilled in the art will be able to modify the constitutions of the present disclosure by omitting, substituting or adding the same according to the specific field of application within the scope of the technical idea.

EXAMPLES

Example 1

On a polyethylene naphthalate (PEN) substrate, molybdenum (Mo) metal was deposited through a sputtering process while a metal mask was fixed to form a gate electrode.

A gate insulating film was formed on the gate electrode by depositing silicon oxide ($SiO_2$) on the gate electrode through the atomic layer deposition (ALD) process.

Again, tantalum (Ta) metal as an oxygen deficiency-inducing material was deposited on the gate insulating film through a sputtering process while a metal mask was fixed to form a layer of the oxygen deficiency-inducing material. The thickness was formed to be about 7 nm.

While the metal mask was fixed on the layer of the oxygen deficiency-inducing material, a patterned semiconductor material of indium-gallium oxide where the molar ratio of indium to gallium was 7:3 was deposited to a thickness of about 20 nm through a sputtering process, and a channel layer was formed by annealing for 1 hour at a temperature of about 150° C. in an air atmosphere.

While the metal mask was fixed again on the channel layer, a molybdenum metal was deposited on both ends thereof. The formed molybdenum metal layer was formed to partially contact both ends of the channel layer. The molybdenum metal layers formed at both ends were formed so as not to contact each other such that they became a source electrode and a drain electrode, respectively.

Again, while a metal mask was fixed, a tantalum metal was deposited on the source electrode and drain electrode that were formed on the channel layer through a sputtering process to form a layer of the oxygen deficiency-inducing material again. In this case, the layer of the oxygen deficiency-inducing material was formed so as not to directly contact the source electrode and the drain electrode, and the oxygen deficiency-inducing layer was formed with a thickness of about 10 nm.

After depositing both of the oxygen deficiency-inducing material layers, the thin film transistor device was heat-treated at a temperature of 150° C. for 1 hour to form an oxygen deficiency-inducing layer, thereby manufacturing a transistor device according to the present disclosure.

During the sputtering process in Example 1, the partial pressures between argon (Ar) gas and oxygen gas (02) were adjusted to maintain 18 sccm and 2 sccm, respectively.

Example 2

A transistor device was manufactured in the same manner as in Example 1, except that aluminum oxide ($Al_2O_3$) was used as the gate insulating film.

Example 3

A transistor device was manufactured in the same manner as in Example 1, except that it was formed of an indium-gallium oxide where the molar ratio of indium and gallium included in the channel layer was changed to 8:2.

Example 4

A transistor device was manufactured in the same manner as in Example 1, except that when depositing the oxide channel layer using a sputtering process, the partial pressure conditions of argon (Ar) and oxygen (02) were changed as shown in Table 1 below.

Example 5

A transistor device was manufactured in the same manner as in Example 1, except that a polyimide material was used as the substrate.

Example 6

A transistor device was manufactured in the same manner as in Example 1, except that a silicon wafer on which silicon oxide was deposited was used as the substrate.

Example 7

A transistor device was manufactured in the same manner as in Example 1, except that the thicknesses of the tantalum layer formed on the gate insulating film and the channel layer were 20 nm and 10 nm, respectively.

Example 8

A transistor device was manufactured in the same manner as in Example 1, except that the thicknesses of the tantalum layer formed on the gate insulating film and the channel layer were 2 nm and 20 nm, respectively.

Comparative Example 1

A transistor device was manufactured in the same manner as in Example 1, except that the tantalum metal was not deposited on the gate insulating film.

Comparative Example 2

A transistor device was manufactured in the same manner as Example 1, except that the tantalum metal was not deposited on both of the gate insulating film and the channel layer.

Comparative Example 3

A transistor device was manufactured in the same manner as in Example 1, except that after forming the tantalum layer, annealing was performed at an annealing temperature of 300° C.

Comparative Example 4

A transistor device was manufactured in the same manner as in Example 1, except that after forming the tantalum layer, annealing was performed at an annealing temperature of 100° C.

TABLE 1

| Classification | Thickness ratio of second insulating layer/channel layer | Annealing temperature | Substrate | Type of gate insulating film | Component of channel ratio (molar ratio) |
|---|---|---|---|---|---|
| Example 1 | 7:20 (7 nm:20 nm) | 150° C. | PEN | $SiO_2$ | IGO(In:Ga = 7:3) |
| Example 2 | 7:20 | 150° C. | PEN | $Al_2O_3$ | IGO(In:Ga = 7:3) |
| Example 3 | 7:20 | 150° C. | PEN | $SiO_2$ | IGO(In:Ga = 8:2) |
| Example 4 | 7:20 | 150° C. | PEN | $SiO_2$ | IGO(In:Ga = 7:3) |
| Example 5 | 7:20 | 150° C. | PI | $SiO_2$ | IGO(In:Ga = 7:3) |
| Example 6 | 7:20 | 150° C. | Si | $SiO_2$ | IGO(In:Ga = 7:3) |
| Example 7 | 2:1 (20 nm:10 nm) | 150° C. | PEN | $SiO_2$ | IGO(In:Ga = 7:3) |
| Example 8 | 1:10 (2 nm:20 nm) | 150° C. | PEN | $SiO_2$ | IGO(In:Ga = 7:3) |
| Comparative Example 1 | 7:20 | 150° C. | PEN | $SiO_2$ | IGO(In:Ga = 7:3) |
| Comparative Example 2 | 7:20 | 150° C. | PEN | $SiO_2$ | IGO(In:Ga = 7:3) |
| Comparative Example 3 | 7:20 | 300° C. | PEN | $SiO_2$ | IGO(In:Ga = 7:3) |
| Comparative Example 4 | 7:20 | 100° C. | PEN | $SiO_2$ | IGO(In:Ga = 7:3) |

EXPERIMENTAL EXAMPLES

Experimental Example 1: Amorphousness Test of Channel Layer

An X-ray diffraction experiment was performed to determine whether the semiconductor layer was amorphous in the transistor device manufactured according to Example 1 and Comparative Example 1, and the results are shown in FIG. 6. The diffraction spectrum of Example 1 is shown with a red line, and the diffraction spectrum of Comparative Example 1 is shown with a black line. Noise was removed from the X-ray diffraction spectrum of each sample, and the position where the peak appeared was recorded, and whereas diffraction peaks were confirmed in Comparative Example 1 in the 20 range of 30.6°±0.2° and 35.5°±0.2° in the X-ray diffraction spectrum, it can be confirmed that no diffraction peak was found in Example 1, and thus, it did not have crystallinity.

Experimental Example 2: Test of Electrical Characteristics of Thin Film Transistor The electrical transfer characteristics (current-voltage) of the transistor devices manufactured according to Example 1 and Comparative Example 1 were measured to determine field-effect electron mobility (μFE) due to the device electric field, subthreshold swing (SS) below subthreshold voltage (VTH) and threshold voltage were evaluated below, and the results are shown in FIGS. 8a and 8b. The electron mobility due to the electric field of the device of Comparative Example 1 was 24 cm²/Vs, and the subthreshold swing below the subthreshold voltage and subthreshold voltage were 3.2 and −5.2 V, respectively, but it can be seen that the electron mobility due to the electric field of the device of Example 1 was 116 cm²/Vs, and the subthreshold swing below the subthreshold voltage and the threshold voltage were 1.6 and −7.1 V, respectively, showing that mobility and slope characteristics below the subthreshold voltage showed improved values.

Experimental Example 3: Evaluation of Structure and Bonding Characteristics of Channel Layer In order to identify changes in the semiconductor layer in the transistor devices manufactured according to Example 1 and Comparative Example 1, a photoelectron spectroscopy (XPS) spectra analysis experiment was performed in the oxygen 1s state, and the results are shown in FIG. 9a and FIG. 9b. Compared to the device without the oxygen deficiency-inducing material layer, it can be confirmed that the device with the oxygen deficiency-inducing material layer showed a 1.91% increase in bonding strength between metal-oxygen (M-O lattice) and a 3.1% decrease in impurities.

Experimental Example 4: Evaluation of Carrier Concentration and Hole Mobility Characteristics of Channel Layer An experiment was performed to analyze changes in carrier concentration and hole mobility characteristics of the semiconductor layer in the transistor devices manufactured according to Example 1 and Comparative Example 1, and the results are shown in FIGS. 10A and 10B. It can be confirmed that the carrier concentration of oxide semiconductor thin films with the oxygen deficiency-inducing material layer had increased by more than 100 times, and the hole mobility characteristics had also been greatly improved, and it can be seen that this is consistent with the device analysis results shown in FIGS. 8A and 8B

What is claimed is:

1. A thin film transistor, comprising:

a gate electrode;

a first insulating layer formed on the gate electrode;

a second insulating layer formed on the first insulating layer, the second insulating layer comprising an oxide of an element having a bond-dissociation energy with oxygen (O) of 500 KJ/mol or more;

a channel layer comprising a semiconductor material formed on the second insulating layer; and a source electrode and a drain electrode formed on the first insulating layer, the source electrode and the drain electrode located at both ends of the channel layer so as to be not electrically connected directly to each other, but electrically connected through the channel layer, wherein the channel layer has a gradient of oxygen concentration in which the concentration of oxygen increases as it goes into the interior from the vicinity of an interface in contact with the second insulating layer.

2. The thin film transistor of claim 1, wherein an oxygen deficiency-inducing layer comprising an element having a bond-dissociation energy with oxygen of 500 KJ/mol or more is further provided on the channel layer.

3. The thin film transistor of claim 2, wherein the element of the second insulating layer is the same as the element of the oxygen deficiency-inducing layer.

4. The thin film transistor of claim 2, wherein the oxygen deficiency-inducing layer comprises an oxide which is formed by combining oxygen comprised in the channel layer with an element having an oxygen bond-dissociation energy of 500 kJ/mol or more, and wherein the oxygen deficiency-inducing layer has an oxygen concentration gradient in which the oxygen concentration near an interface in contact with the channel layer is higher than the opposite surface.

5. The thin film transistor of claim 2, wherein the semiconductor layer has an oxygen concentration gradient in which the oxygen concentration is highest at the center of the layer and the oxygen concentration decreases toward both interfaces in contact with the second insulating layer and the oxygen deficiency-inducing layer.

6. The thin film transistor of claim 1, wherein a semiconductor material of the channel layer comprises an amorphous metal oxide.

7. The thin film transistor of claim 6, wherein the channel layer comprises at least one oxide selected from amorphous zinc (Zn), indium (In), gallium (Ga), nickel (Ni), copper (Cu), or tin (Sn).

8. The thin film transistor of claim 7, wherein the channel layer comprises an amorphous indium-gallium oxide.

9. The thin film transistor of claim 1, wherein the second insulating layer is in direct contact with the source electrode and the drain electrode, but does not conduct electricity through the second insulating layer.

10. The thin film transistor of claim 9, wherein the channel layer does not exhibit diffraction peaks in the 2θ range of 30.6°±0.2° and 35.5°±0.2° in the X-ray diffraction spectrum.

11. The thin film transistor of claim 6, wherein the channel layer has a reduction rate of oxygen concentration of 30% to 70% as calculated according to Mathematical Formula 1 below:

$$\Delta C_O(\%) = \frac{C_{Oi} - C_{Of}}{C_{Oi}} \times 100(\%) \qquad \text{[Mathematical Formula 1]}$$

wherein in Mathematical Formula 1 above, $\Delta C_O$ represents the oxygen concentration reduction rate, $C_{Oi}$ represents the oxygen concentration of the amorphous oxide comprised in the channel layer in a pure state, and $C_{Of}$ represents the oxygen concentration comprised in the entire semiconductor layer of the thin film transistor, respectively.

12. The thin film transistor of claim 11, wherein the channel layer has a thickness of 5 nm to 100 nm.

13. The thin film transistor of claim 1, wherein the element having a bond-dissociation energy with oxygen (O) of 500 KJ/mol or more in the first insulating layer comprises at least one of tantalum (Ta), strontium (Sr), calcium (Ca), gadolinium (Gd), scandium (Sc), zirconium, (Zr), aluminum (Al), titanium (Ti), niobium (Nb), silicon (Si), germanium (Ge), boron (B), molybdenum (Mo), phosphorus (P), tungsten (W), sulfur (S), hafnium (Hf), lanthanum (La), yttrium (Y), or carbon (C).

14. The thin film transistor of claim 2, wherein the element having a bond-dissociation energy with oxygen (O) of 500 KJ/mol or more in the oxygen deficiency-inducing layer comprises at least one of tantalum (Ta), strontium (Sr), calcium (Ca), gadolinium (Gd), scandium (Sc), zirconium, (Zr), aluminum (Al), titanium (Ti), niobium (Nb), silicon (Si), germanium (Ge), boron (B), molybdenum (Mo), phosphorus (P), tungsten (W), sulfur (S), hafnium (Hf), lanthanum (La), yttrium (Y), or carbon (C).

15. A transistor device, comprising:
a plastic substrate comprising a polymer having a softening point of 50° C. to 350° C.; and
the thin film transistor according to claim 1 formed on the plastic substrate.

16. The transistor device of claim 15, wherein the gate electrode is in contact on the plastic substrate.

17. The transistor device of claim 15, wherein the source electrode and the drain electrode are in contact on the plastic substrate, and the gate electrode is not in contact with the plastic substrate.

18. The transistor device of claim 15, wherein the polymer having a softening point of 50° C. to 350° C. comprises at least one selected from polyethersulfone (PES), polyethylene naphthalate (PEN), polyether ether ketone (PEEK), polyethylene terephthalate (PET), polyarylate (PAR), cyclic olefin polymer (COP), polynorbomene, polycarbonate (PC), polyimide (PI), or fiber reinforced plastic (FRP).

\* \* \* \* \*